(12) United States Patent
Kawaguchi et al.

(10) Patent No.: US 7,156,904 B2
(45) Date of Patent: Jan. 2, 2007

(54) BONDING LAYER FORMING SOLUTION, METHOD OF PRODUCING COPPER-TO-RESIN BONDING LAYER USING THE SOLUTION, AND LAYERED PRODUCT OBTAINED THEREBY

(75) Inventors: Mutsuyuki Kawaguchi, Amagasaki (JP); Satoshi Saito, Amagasaki (JP); Jun Hisada, Amagasaki (JP); Naomi Kanda, Amagasaki (JP); Toshiko Nakagawa, Amagasaki (JP)

(73) Assignee: Mec Company Ltd., Hyogo (JP)

( * ) Notice: Subject to any disclaimer, the term of this patent is extended or adjusted under 35 U.S.C. 154(b) by 64 days.

(21) Appl. No.: 10/826,091

(22) Filed: Apr. 16, 2004

(65) Prior Publication Data

US 2004/0219377 A1    Nov. 4, 2004

(30) Foreign Application Priority Data

Apr. 30, 2003  (JP)  ............................. 2003-125631
Jun. 9, 2003  (JP)  ............................. 2003-164183

(51) Int. Cl.
| | |
|---|---|
| C23C 18/31 | (2006.01) |
| C23C 18/34 | (2006.01) |
| C23C 18/48 | (2006.01) |
| C23C 30/00 | (2006.01) |

(52) U.S. Cl. .................. 106/1.25; 106/1.27; 106/286.4
(58) Field of Classification Search ............... 106/1.22, 106/1.23, 1.25, 1.26, 1.27, 1.28, 286.4; 427/304
See application file for complete search history.

(56) References Cited

U.S. PATENT DOCUMENTS

| | | | |
|---|---|---|---|
| 5,494,565 A | 2/1996 | Schenzel et al. ............ 205/240 |
| 5,667,849 A | 9/1997 | Carey et al. ................. 427/431 |
| 5,695,822 A | 12/1997 | Carey et al. ................. 427/329 |
| 6,080,497 A | 6/2000 | Carey et al. ................. 428/647 |
| 6,099,713 A * | 8/2000 | Yanada et al. .............. 205/253 |
| 6,180,174 B1 | 1/2001 | Sugawara et al. ........ 427/376.3 |
| 6,183,545 B1 * | 2/2001 | Okuhama et al. ........... 106/1.18 |
| 6,329,074 B1 | 12/2001 | Fujiwara et al. ............ 428/632 |
| 6,361,823 B1 * | 3/2002 | Bokisa et al. .............. 427/97.3 |
| 6,607,653 B1 * | 8/2003 | Tsuji et al. .................. 205/241 |
| 6,797,142 B1 * | 9/2004 | Crosby ........................ 205/145 |
| 6,821,323 B1 * | 11/2004 | Bell et al. ................... 106/1.12 |
| 2003/0035976 A1 | 2/2003 | Strobel ........................ 428/557 |
| 2003/0150743 A1 * | 8/2003 | Obata et al. ................. 205/252 |

(Continued)

FOREIGN PATENT DOCUMENTS

EP    0 216 531    4/1987

(Continued)

*Primary Examiner*—Michael E. Lavilla
(74) *Attorney, Agent, or Firm*—Hamre, Schumann, Mueller & Larson, P.C.

(57) ABSTRACT

An aqueous copper-to-resin bonding layer solution comprising: (a) at least one acid type; (b) tin salt or tin oxide; (c) salt or oxide of at least one type of metal selected from the group consisting of: silver, zinc, aluminum, titanium, bismuth, chromium, iron, cobalt, nickel, palladium, gold, and platinum; (d) a reaction accelerator; and (e) a diffusive retaining solvent, so that an alloy layer of tin and the at least one type of metal selected in (c) is formed on the surface of the copper. Subsequently, a portion of the alloy layer is removed, so that a bonding layer containing an alloy of diffused copper, tin, and the at least one type of metal selected in (c) is formed on a surface of copper which enhances the adhesion between copper and resin. The present invention provides the solution, a method of producing the bonding layer, and a product obtained thereby.

18 Claims, 1 Drawing Sheet

U.S. PATENT DOCUMENTS

2005/0109631 A1    5/2005  Kwon et al. ................ 205/191

FOREIGN PATENT DOCUMENTS

| EP | 0 278 752 | * | 8/1988 |
| EP | 0 310 010 | | 4/1989 |
| EP | 0 469 703 | | 2/1992 |
| JP | 57-67191 | * | 4/1982 |
| JP | 1-109796 | | 4/1989 |
| JP | 4-233793 | | 8/1992 |
| JP | 10-36973 | | 2/1998 |
| JP | 10-144848 | | 5/1998 |
| JP | 11-21673 | | 1/1999 |
| JP | 11-021673 | * | 1/1999 |
| JP | 11-121924 | | 4/1999 |
| JP | 2000-340948 | | 12/2000 |

* cited by examiner

BONDING LAYER FORMING SOLUTION, METHOD OF PRODUCING COPPER-TO-RESIN BONDING LAYER USING THE SOLUTION, AND LAYERED PRODUCT OBTAINED THEREBY

BACKGROUND OF THE INVENTION

1. Field of the Invention

The present invention relates to a bonding layer forming solution, a method of producing a copper-to-resin bonding layer using the solution, and a layered product obtained thereby. More specifically, this invention relates to a bonding layer forming solution that is used for various types of electronic components such as a printed wiring board, components to be mounted on a semiconductor, liquid crystal devices, electroluminescent elements and the like, a method of producing a copper-to-resin bonding layer using the solution, and a layered product obtained thereby.

2. Related Background Art

Multilayer wiring boards in common use are produced in the following manner. That is, an inner-layer substrate having a conductive layer of copper on its surface is press-laminated to another inner-layer substrate and copper foil so as to sandwich a prepreg between them. Electrical connections between the respective conductive layers are established by way of through-holes, i.e. piercing holes whose walls are plated with copper. In order to enhance adhesion to the prepreg, a needle-like layer of copper oxide that is referred to as a black oxide or a brown oxide is formed on the copper surface of the inner-layer substrate. In this method, the needle-like layer of copper oxide cuts into the prepreg to produce the anchoring effect, thereby enhancing adhesion. While exhibiting excellent adhesion to the prepreg, the layer of copper oxide dissolves and discolors when brought into contact with an acidic liquid in a process of plating the through-holes, and thus is likely to cause a defect called haloing, which is problematic.

With respect to this problem, as an alternative to the method using a black oxide or a brown oxide, a method in which a tin layer is formed on a copper surface of an inner-layer substrate has been proposed as in EP Publication No. 0 216 531 A1 and JP 4(1992)-233793 A. Further, JP 1(1989)-109796 A proposes that a copper surface be plated with tin and then further treated with a silane coupling agent so that adhesion between copper and resin is enhanced. Further, JP2000-340948 A proposes forming a copper-tin alloy layer on a copper surface so as to enhance adhesion between copper and resin. Further, it also is proposed that the copper surface be roughened by etching so as to produce the anchoring effect.

However, in each of the above-mentioned methods in which a tin layer or a copper-tin alloy layer is formed on a copper surface, with respect to a so-called hard resin, which is a type of resin having a high glass transition temperature, the effect of enhancing adhesion may not be attained sufficiently, which has been disadvantageous. Further, in the above-mentioned method described in JP 1(1989)-109796 A, tin plating causes copper to be eluted into a plating solution, resulting in the narrowing of wiring. Moreover, when in use, silane coupling agents are hard to handle, which is problematic. Further, adhesion to resin is not attained sufficiently.

SUMMARY OF THE INVENTION

In order to solve the above-mentioned problems with the conventional technique, it is the object of the present invention to provide a bonding layer forming solution that allows adhesion between copper and resin to be enhanced further, a method of producing a copper-to-resin bonding layer using the solution, and a layered product obtained thereby.

In order to achieve the above-mentioned object, an aqueous solution for forming a copper-to-resin bonding layer according to the present invention comprises:

(a) at least one type of acid selected from inorganic acid and organic acid;
(b) tin salt or tin oxide;
(c) salt or oxide of at least one type of metal selected from the group consisting of: silver, zinc, aluminum, titanium, bismuth, chromium, iron, cobalt, nickel, palladium, gold, and platinum;
(d) a reaction accelerator; and
(e) a diffusive retaining solvent.

A method of producing a copper-to-resin bonding layer according to the present invention includes:

bringing a surface of copper into contact with an aqueous solution for forming a bonding layer for bonding resin, which comprises:

(a) at least one type of acid selected from inorganic acid and organic acid;
(b) tin salt or tin oxide;
(c) salt or oxide of at least one type of metal selected from the group consisting of: silver, zinc, aluminum, titanium, bismuth, chromium, iron, cobalt, nickel, palladium, gold, and platinum;
(d) a reaction accelerator; and
(e) a diffusive retaining solvent, so that an alloy layer of tin and the at least one type of metal selected in (c) is formed on the surface of the copper, and subsequently removing a portion of the alloy layer of the tin and the at least one type of metal selected in (c) other than a portion of the alloy layer that is a layer in which the copper, the tin, and the at least one type of metal selected in (c) are diffused, so that a bonding layer for bonding resin containing an alloy of copper, tin, and the at least one type of metal selected in (c) is formed on a surface of copper.

A layered product formed from copper and resin according to the present invention is a layered product in which copper and resin are integrated. In the layered product, a bonding layer for bonding resin containing an alloy of copper, tin, and at least one type of metal selected from the group consisting of: silver, zinc, aluminum, titanium, bismuth, chromium, iron, cobalt, nickel, palladium, gold, and platinum is present on a surface of the copper that is in contact with the resin.

DETAILED DESCRIPTION OF THE INVENTION

Figure 1:
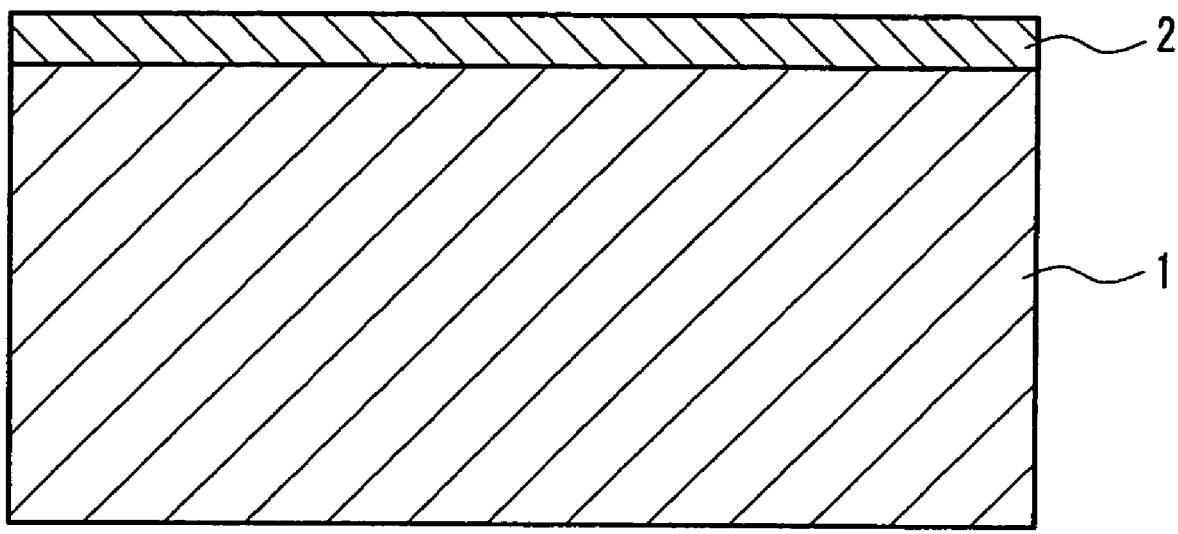
FIG. 1 is a cross-sectional view of a bonding layer for bonding resin formed on a copper surface of one example according to the present invention.

In the method of producing a copper-to-resin bonding layer according to the present invention, a bonding layer for bonding resin that is formed from an alloy of copper, tin, and at least one type of metal (hereinafter, referred to also as a "third metal") selected from the group consisting of: silver, zinc, aluminum, titanium, bismuth, chromium, iron, cobalt, nickel, palladium, gold, and platinum is formed on a surface of copper. The bonding layer for bonding resin allows adhesion between copper and resin to be improved.

The description is directed to the solution for forming a copper-to-resin bonding layer according to the present invention. First, as for acid, in order to form a surface that provides excellent adhesion, acids are mixed so that a pH is regulated according to the type of tin salt. Acids that can be used in the present invention include: inorganic acids such as hydrochloric acid, sulfuric acid, nitric acid, fluoroboric acid, phosphoric acid and the like; and water-soluble organic acids including carboxylic acids such as formic acid, acetic acid, propionic acid, butyric acid and the like, alkanesulfonic acids such as methanesulfonic acid, ethanesulfonic acid and the like, and aromatic sulfonic acids such as benzenesulfonic acid, phenolsulfonic acid, cresolsulfonic acid and the like. Among these, sulfuric acid is preferred in terms of the speed at which a bonding layer for bonding resin is formed, the solubility of tin compounds therein, and the like. The concentration of acid is in a range of preferably, 1 to 50% (mass %, the same applies hereinafter), more preferably, 5 to 40%, and most preferably, 10 to 30%. With a concentration higher than 50%, adhesion to resin tends to decrease. Further, with a concentration lower than 1%, the formation of a bonding layer for bonding resin is not attained.

In the present invention, there is no particular limit to the tin salt to be used, and any type of tin salt can be used as long as the tin salt is soluble. Salts formed from tin and the above-mentioned acids are preferred in terms of their solubility. For example, stannous salts and stannic salts such as stannous sulfate, stannic sulfate, stannous fluoroborate, stannous fluoride, stannic fluoride, stannous nitrate, stannic nitrate, stannous chloride, stannic chloride, stannous formate, stannic formate, stannous acetate, stannic acetate and the like can be used. Among these, stannous salts are used preferably in order to allow a bonding layer for bonding resin to be formed at a high speed, and stannic salts are used preferably in order to attain high stability in solutions into which tin salts are dissolved. As the tin oxide, stannous oxide is used preferably.

The concentration of tin salt or tin oxide in terms of the concentration of tin is in a range of preferably, 0.05 to 10%, more preferably, 0.1 to 5%, and most preferably, 0.5 to 3%. With a concentration higher than 10%, adhesion to resin tends to decrease, and with a concentration lower than 0.05%, the formation of a bonding layer for bonding resin is hindered.

As a third metal, at least one type of metal selected from the group consisting of: silver, zinc, aluminum, titanium, bismuth, chromium, iron, cobalt, nickel, palladium, gold, and platinum is used. Each of these metals together with copper and tin forms an alloy that allows adhesion to resin to be enhanced considerably, and is easy to handle.

There is no particular limit to salt or oxide of a third metal, and any type of salt or oxide of a third metal can be used as long as the salt or oxide is soluble. There is no particular limit to a valence of metal. For example, oxides such as $Ag_2O$, $ZnO$, $Al_2O_3$, $TiO_2$, $Bi_2O_3$, $Cr_2O_3$ and the like, halides such as $AgCl$, $ZnI_2$, $AlBr_3$, $BiI_3$, $FeCl_3$, $PdCl_2$, $AuCl$ and the like, salts formed from metal and inorganic acids such as $Ag_2SO_4$, $Zn(NO_3)_2$, $Al(NO_3)_3$, $NiSO_4$, $CoSO_4$ and the like, and salts formed from metal and organic acids such as $CH_3COOAg$, $(HCOO)_2Zn$ and the like are used. The concentration of the metal salt or oxide in terms of the concentration of metal is preferably, 0.1 to 20%, more preferably, 0.5 to 10%, and most preferably, 1 to 5%. With a concentration higher than 20% or lower than 0.1%, the adhesion to resin tends to decrease.

In this specification, a reaction accelerator refers to an agent that is coordinated to copper as a base material to form a chelate and facilitates forming a bonding layer for bonding resin on a copper surface. For example, thiourea derivatives such as thiourea, 1,3-dimethyl thiourea, 1,3-diethyl-2-thiourea, thioglycolic acid and the like are used. The concentration of a reaction accelerator is in a range of preferably, 1 to 50%, more preferably, 5 to 40%, and most preferably, 10 to 30%. When the concentration of a reaction accelerator is higher than 50%, the adhesion to resin tends to decrease. Further, when the concentration of a reaction accelerator is lower than 1%, the speed at which a bonding layer for bonding resin is formed tends to be low.

In this specification, a diffusive retaining solvent refers to a solvent that facilitates the maintenance of the concentration of a reactive component required for the formation of a bonding layer for bonding resin in the vicinity of a copper surface. Examples of a diffusive retaining solvent include glycols such as ethylene glycol, diethylene glycol, propylene glycol and the like, and glycol esters such as cellosolve, carbitol, butyl carbitol and the like. The concentration of a diffusive retaining solvent is in a range of preferably, 1 to 80%, more preferably, 5 to 60%, and most preferably, 10 to 50%. With a concentration higher than 80%, adhesion to resin tends to decrease. Further, with a concentration lower than 1%, the formation of a bonding layer for bonding resin tends to be hindered.

The solution for forming a bonding layer for bonding resin according to the present invention may contain copper salt such as $CuSO_4$, $CuCl_2$ or the like as another component.

Furthermore, various additives such as a surface-active agent for forming a uniform bonding layer for bonding resin and the like may be added as required.

The bonding layer forming solution according to the present invention can be prepared easily by dissolving the above-mentioned components in water. As the water, preferably, waters without ionic substances or impurities such as ion-exchanged water, pure water, ultra pure water and the like are used.

In order to form a bonding layer for bonding resin using the above-mentioned bonding layer forming solution, initially, a surface of copper is brought into contact with the above-mentioned solution for forming a bonding layer for bonding resin. There is no particular limit to copper to be used, and any type of copper is used as long as the copper is intended to be bonded to resin. A surface of copper can be a surface of copper in various uses such as in the forms of, for example, foil (electrodeposited copper foil, rolled copper foil), a plated film (electroless copper plated film, electrolytic copper plated film), a wire, a rod, a tube, a plate and the like, which are used for electronic components such as an electronic substrate, a lead frame and the like, ornamentation, construction materials and the like. The copper may contain another element according to its intended use and thus may be brass, bronze, cupro-nickel, arsenic copper, silicon copper, titanium copper, chromium copper or the like. The copper surface may be smooth in shape or roughened by etching or the like. For example, in order to attain the anchoring effect when the surface is laminated to resin, preferably, the surface is roughened. Further, in the case of recently used copper wiring through which a high-frequency electric signal passes, preferably, the surface is a smooth surface having a centerline average roughness Ra of not more than 0.1 µm. Particularly, in the case of fine copper wiring, in the present invention, the occurrence of, for example, breaking due to etching for obtaining roughness is prevented for the following reason. That is, in the present invention, even a smooth surface can provide sufficient adhesion without the anchoring effect attained by surface roughening.

There is no particular limit to a condition under which a surface of copper is brought into contact with the above-mentioned bonding layer forming solution. For example, the surface should be brought into contact with the solution at a temperature of preferably, 10 to 70° C., and more preferably, 20 to 40° C. for 5 seconds to 5 minutes by the dipping method or the like. When an alloy layer of tin and the third metal is formed on a surface of copper in this manner, an alloy layer (bonding layer) of copper, tin, and the third metal is formed by diffusion at an interface between copper and tin with the third metal. In order to accelerate the diffusion, a heat treatment or the like may be performed.

Next, the alloy layer of tin and the third metal above the alloy layer (bonding layer) of copper, tin, and the third metal is removed selectively, and thus the bonding layer is formed on the copper surface. As a method for selectively removing the alloy layer of tin and the third metal, for example, the alloy layer of tin and the third metal is etched selectively using an etchant. As the etchant used for selective etching, for example, a "MEC Remover S-651A", a trade name of MEC Company Ltd. or the like can be used. As another example of the etchant, an aqueous solution containing inorganic acid such as nitric acid or the like also can be used. By selecting the composition of the bonding layer forming solution, a condition under which a surface of copper is brought into contact with the solution, and the state of the surface of copper, a bonding layer formed from copper, tin, and the third metal also may be formed directly on the surface of copper.

A bonding layer for bonding resin formed on a copper surface as described above generally has a thickness of not more than 1 µm and enhances adhesion between copper and resin considerably.

In the present invention, as resin to be bonded to copper, thermoplastic resins such as AS resin, ABS resin, fluororesin, polyamide, polyethylene, polyethylene terephthalate, polyvinylidene chloride, polyvinyl chloride, polycarbonate, polystyrene, polysulfone, polypropylene, liquid crystal polymer and the like, and thermosetting resins such as epoxy resin, phenol resin, polyimide, polyurethane, bismaleimide triazine resin, modified polyphenylene ether, cyanate ester and the like can be used. These resins also may be of a type modified with a functional group or toughened with, for example, glass fibers, aramid fibers or other types of fibers.

In the case where the layered product according to the present invention constitutes a wiring board in which the bonding layer is formed on a surface of a conductive layer, a highly reliable wiring board is obtained by attaining excellent adhesion to an interlayer insulating resin (prepreg, adhesive for electroless plating, film-like resin, liquid resin, photosensitive resin, thermosetting resin, thermoplastic resin), solder resist, etching resist, conductive resin, conductive paste, conductive adhesive, dielectric resin, resin for filling holes, flexible coverlay film and the like.

The layered product according to the present invention is useful particularly as a build-up wiring board in which fine copper wiring and via holes are formed. The build-up wiring boards are categorized as a type formed by the simultaneous lamination method and a type formed by the sequential build-up method.

Furthermore, in a so-called metal core substrate in which a copper plate is used as a core material, in the case where the surface of the copper plate constitutes the above-mentioned bonding layer for bonding resin, a metal core substrate that exhibits excellent adhesion between the copper plate and an insulating resin that is laminated to the copper plate is obtained.

FIG. 1 is a cross-sectional view of a bonding layer for bonding resin formed on a copper surface of one example according to the present invention. That is, a bonding layer 2 for bonding resin is formed on the surface of a copper base material 1.

According to the present invention, a bonding layer for bonding resin formed from an alloy of copper, tin, and a third metal is formed on a copper surface, and thus a bonding layer forming solution that allows adhesion between copper and resin to be enhanced further, a method of producing a copper-to-resin bonding layer using the solution, and a layered product obtained thereby can be provided.

EXAMPLES

Hereinafter, the present invention will be described more specifically by way of examples.

Examples 1 to 11

(1) Delamination Test

A copper-clad laminate (glass cloth-epoxy resin, FR-4 grade) with copper foil of 18 µm in thickness laminated on each surface thereof was used. With respect to each example, the copper foil on each surface of the laminate was cleaned by spraying 5% hydrochloric acid thereon at room temperature for 10 seconds, and then washed with water and dried.

Next, the copper foil was dipped into bonding layer forming solutions, respectively, which were obtained by mixing components shown in Tables 1 and 2, under the condition of a temperature of 30° C. and a dipping time of 30 seconds, and then washed with water and dried.

Next, the copper foil was dipped into a "MEC Remover S-651A" (aqueous solution mainly containing nitric acid), a trade name of MEC Company Ltd., at room temperature for 30 seconds, and then washed with water and dried, and thus a bonding layer (alloy layer) for bonding resin was formed on the surface of the copper foil.

Next, in order to evaluate the adhesion between copper foil of the laminate thus obtained and resin, a layered product was formed in the following manner. That is, a resin with copper foil for a build-up wiring board (ABF-SHC resin with copper foil produced by Ajinomoto Co., Inc.) was laminated on each surface of the laminate, and pressing was performed while applying heat. Then, the peripheral portion of the laminate with the resins was cut off, and thus a layered product having an area of 10 cm by 10 cm was obtained. Next, the copper foil of the resin with copper foil on each surface was removed by etching, and then a load was applied in such a manner that the layered product was kept at 121° C., 100% RH, and 2 atmospheric pressure for 8 hours using a pressure cooker. After that, in compliance with JIS C 6481, the layered product was dipped into a molten solder bath at a temperature of 290° C. for 1 minute, and examined for peeling (bulge of the resin) between the copper foil and the resin. The results are shown in Tables 1 and 2.

(2) Peel Strength Test

With respect to each example, the surface of electrodeposited copper foil of 35 μm in thickness was treated in the same manner as in the case of samples for the above-mentioned delamination test, and thus a bonding layer for bonding resin was formed on the surface.

Next, a resin with copper foil for a build-up wiring board (ABF-SHC resin with copper foil produced by Ajinomoto Co., Inc.) was laminated on one surface of copper foil thus obtained, and pressing was performed while applying heat. In compliance with JIS C 6481, a layered product thus obtained was examined for the peel strength of the electrodeposited copper foil. The results are shown in Tables 1 and 2.

TABLE 1

| Ex. | Composition of a solution for forming a bonding layer for bonding resin | (mass %) | | Delamination test | Peel strength test (kgf/cm) | Thickness of a bonding layer for bonding resin (μm) |
|---|---|---|---|---|---|---|
| 1 | Acetic acid | 20 | | Peeling not caused | 1.15 | 0.009 |
|   | Stannous acetate | 2 | (in terms of $Sn^{2+}$) | | | |
|   | Silver acetate | 3 | (in terms of $Ag^+$) | | | |
|   | Thiourea | 15 | | | | |
|   | Diethylene glycol | 30 | | | | |
|   | Ion-exchanged water | rest | | | | |
| 2 | Acetic acid | 17 | | Peeling not caused | 1.08 | 0.015 |
|   | Stannous acetate | 2 | (in terms of $Sn^{2+}$) | | | |
|   | Bismuth iodide | 1.5 | (in terms of $Bi^{3+}$) | | | |
|   | Thiourea | 21 | | | | |
|   | Cellosolve | 32 | | | | |
|   | Ion-exchanged water | rest | | | | |
| 3 | Acetic acid | 20 | | Peeling not caused | 1.09 | 0.008 |
|   | Stannous acetate | 1.2 | (in terms of $Sn^{2+}$) | | | |
|   | Aluminum nitrate | 1.5 | (in terms of $Al^{3+}$) | | | |
|   | Thiourea | 26.5 | | | | |
|   | Ethylene glycol | 20 | | | | |
|   | Ion-exchanged water | rest | | | | |
| 4 | Sulfuric acid | 15 | | Peeling not caused | 1.00 | 0.007 |
|   | Stannous sulfate | 1.5 | (in terms of $Sn^{2+}$) | | | |
|   | Nickel sulfate | 3.5 | (in terms of $Ni^{2+}$) | | | |
|   | Thiourea | 21 | | | | |
|   | Diethylene glycol | 30 | | | | |
|   | Ion-exchanged water | rest | | | | |
| 5 | Acetic acid | 50 | | Peeling not caused | 1.05 | 0.087 |
|   | Stannous acetate | 3 | (in terms of $Sn^{2+}$) | | | |
|   | Silver nitrate | 0.1 | (in terms of $Ag^+$) | | | |
|   | Thiourea | 10 | | | | |
|   | Diethylene glycol | 5 | | | | |
|   | Ion-exchanged water | rest | | | | |

TABLE 2

| Ex. | Composition of a solution for forming a bonding layer for bonding resin | (mass %) | | Delamination test | Peel strength test (kgf/cm) | Thickness of a bonding layer for bonding resin (μm) |
|---|---|---|---|---|---|---|
| 6 | Methanesulfonic acid | 1 | | Peeling not caused | 0.98 | 0.003 |
|   | Stannous methanesulfonic acid | 0.05 | (in terms of $Sn^{2+}$) | | | |
|   | Zinc formate | 20 | (in terms of $Zn^{2+}$) | | | |
|   | 1,3-dimethyl thiourea | 50 | | | | |
|   | Propylene glycol | 1 | | | | |
|   | Ion-exchanged water | rest | | | | |
| 7 | Hydrochloric acid | 10 | | Peeling not caused | 1.01 | 0.120 |
|   | Stannous sulfate | 1 | (in terms of $Sn^{2+}$) | | | |
|   | Cobalt sulfate | 1.5 | (in terms of $Co^{2+}$) | | | |
|   | 1,3-diethyl-2-thiourea | 1 | | | | |
|   | Ethylene glycol | 80 | | | | |
|   | Ion-exchanged water | rest | | | | |

TABLE 2-continued

| Ex. | Composition of a solution for forming a bonding layer for bonding resin | (mass %) | | De-lamination test | Peel strength test (kgf/cm) | Thickness of a bonding layer for bonding resin (μm) |
|---|---|---|---|---|---|---|
| 8 | Sulfuric acid | 20 | | Peeling not caused | 1.11 | 0.01 |
|   | Stannous sulfate | 1.8 | (in terms of $Sn^{2+}$) | | | |
|   | Nickel sulfate | 3.2 | (in terms of $Ni^{2+}$) | | | |
|   | Thioglycolic acid | 21 | | | | |
|   | Diethylene glycol | 30 | | | | |
|   | Ion-exchanged water | rest | | | | |
| 9 | Sulfuric acid | 22 | | Peeling not caused | 1.10 | 0.004 |
|   | Stannic chloride | 3 | (in terms of $Sn^{4+}$) | | | |
|   | Nickel chloride | 3 | (in terms of $Ni^{2+}$) | | | |
|   | Thiourea | 20 | | | | |
|   | Diethylene glycol | 30 | | | | |
|   | Ion-exchanged water | 22 | | | | |
| 10 | Acetic acid | 30 | | Peeling not caused | 0.98 | 0.003 |
|    | Stannic acetate | 3 | (in terms of $Sn^{4+}$) | | | |
|    | Nickel sulfamate | 3 | (in terms of $Ni^{2+}$) | | | |
|    | Thiourea | 15 | | | | |
|    | Butyl carbitol | 30 | | | | |
|    | Ion-exchanged water | 19 | | | | |
| 11 | Hydrochloric acid | 14 | | Peeling not caused | 0.85 | 0.135 |
|    | Stannous chloride | 10 | (in terms of $Sn^{4+}$) | | | |
|    | Cobalt sulfate | 10.5 | (in terms of $Co^{2+}$) | | | |
|    | Thiourea | 16 | | | | |
|    | Carbitol | 30 | | | | |
|    | Ion-exchanged water | rest | | | | |

Example 12

A copper-clad laminate (glass cloth-epoxy resin, FR-4 grade) with copper foil of 18 μm in thickness laminated on each surface thereof was used. The copper foil on each surface of the laminate was cleaned by spraying 5% hydrochloric acid thereon at room temperature for 10 seconds, and then washed with water and dried. Next, the copper foil was dipped into a bonding layer forming solution that was obtained by mixing components shown in Table 3 under the condition of a temperature of 30° C. and a dipping time of 30 seconds, and then washed with water and dried, and thus a bonding layer for bonding resin was formed directly on the surface of the copper foil.

Next, in the same manner as in Example 1, a layered product was formed by laminating resins for a build-up wiring board and examined. The result is shown in Table 3.

Example 13

A layered product was formed in the same manner as in Example 1 except that two sheets of prepreg (glass cloth-epoxy resin) were used in place of resins with copper foil for a build-up wiring board, and examined. The result is shown in Table 3.

Example 14

A layered product was formed in the same manner as in Example 1 except that two sheets of prepreg (glass cloth-bismaleimide triazine resin) were used in place of resins with copper foil for a build-up wiring board, and examined. The result is shown in Table 3.

Example 15

A layered product was formed in the same manner as in Example 1 except that two sheets of prepreg (glass cloth-polyphenylene ether) were used in place of resins with copper foil for a build-up wiring board, and examined. The result is shown in Table 3.

Comparative Example 1

A copper-clad laminate (glass cloth-epoxy resin, FR-4 grade) with copper foil of 18 μm in thickness laminated on each surface thereof was used. The copper foil on each surface of the laminate was cleaned by spraying 5% hydrochloric acid thereon at room temperature for 10 seconds, and then washed with water and dried. Next, the copper foil was dipped into a tin layer forming solution that was obtained by mixing components shown in Table 3 under the condition of a temperature of 30° C. and a dipping time of 30 seconds, and then washed with water and dried, and thus a tin layer was formed on the surface of the copper foil.

Next, in the same manner as in Example 1, a layered product was formed by laminating resins for a build-up wiring board and examined. The result is shown in Table 3.

Comparative Example 2

A tin layer was formed on the surface of copper foil in the same manner as in Comparative Example 1. Next, the copper foil with the tin layer was dipped into "MEC Remover S-651A", a trade name of MEC Company Ltd., at room temperature for 30 seconds, then washed with water and dried, and thus a copper-tin alloy layer was formed on the surface of the cooper foil.

Next, a layered product was formed by laminating resins for a build-up wiring board in the same manner as in Example 1 and examined. The result is shown in Table 3.

TABLE 3

| Ex. | Composition of a solution for forming a bonding layer for bonding resin | (mass %) | | Delamination test | Peel strength test (kgf/cm) | Thickness of a bonding layer for bonding resin (μm) |
|---|---|---|---|---|---|---|
| 12 | Acetic acid | 20 | | Peeling not caused | 1.01 | 0.095 |
| | Stannous acetate | 2 | (in terms of $Sn^{2+}$) | | | |
| | Silver acetate | 2 | (in terms of $Ag^+$) | | | |
| | Copper sulfate | 1 | (in terms of $Cu^{2+}$) | | | |
| | Thiourea | 15 | | | | |
| | Diethylene glycol | 30 | | | | |
| | Ion-exchanged water | rest | | | | |
| 13 | Acetic acid | 20 | | Peeling not caused | 0.95 | 0.009 |
| | Stannous acetate | 2 | (in terms of $Sn^{2+}$) | | | |
| | Silver acetate | 3 | (in terms of $Ag^+$) | | | |
| | Thiourea | 15 | | | | |
| | Diethylene glycol | 30 | | | | |
| | Ion-exchanged water | rest | | | | |
| 14 | Acetic acid | 20 | | Peeling not caused | 0.85 | 0.009 |
| | Stannous acetate | 2 | (in terms of $Sn^{2+}$) | | | |
| | Silver acetate | 3 | (in terms of $Ag^+$) | | | |
| | Thiourea | 15 | | | | |
| | Diethylene glycol | 30 | | | | |
| | Ion-exchanged water | rest | | | | |
| 15 | Acetic acid | 20 | | Peeling not caused | 0.80 | 0.009 |
| | Stannous acetate | 2 | (in terms of $Sn^{2+}$) | | | |
| | Silver acetate | 3 | (in terms of $Ag^+$) | | | |
| | Thiourea | 15 | | | | |
| | Diethylene glycol | 30 | | | | |
| | Ion-exchanged water | rest | | | | |
| Com. Ex. 1 | Acetic acid | 20 | | Peeling caused | 0.20 | (Thickness of a tin layer) 0.20 |
| | Stannous acetate | 2 | (in terms of $Sn^{2+}$) | | | |
| | Thiourea | 15 | | | | |
| | Diethylene glycol | 30 | | | | |
| | Ion-exchanged water | rest | | | | |
| Com. Ex. 2 | Acetic acid | 20 | | Peeling caused | 0.35 | (Thickness of a copper-tin alloy layer) 0.05 |
| | Stannous acetate | 2 | (in terms of $Sn^{2+}$) | | | |
| | Thiourea | 15 | | | | |
| | Diethylene glycol | 30 | | | | |
| | Ion-exchanged water | rest | | | | |

As is apparent from Tables 1 to 3, it was confirmed that the respective bonding layers for bonding resin of Examples according to the present invention had high peel strength (adhesion) between copper foil and resin.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An aqueous solution for forming a copper-to-resin bonding layer, comprising:
   (a) at least one type of acid selected from inorganic acid and organic acid;
   (b) tin salt or tin oxide wherein the concentration of the tin salt or tin oxide in terms of the concentration of tin is in a range of 0.1 to 5 mass %;
   (c) salt or oxide of at least one type of metal selected from the group consisting of: silver, zinc, aluminum, titanium, bismuth, chromium, iron, cobalt, nickel, palladium, gold, and platinum wherein the concentration of the salt or oxide of the at least one type of metal in terms of the concentration of metal is 0.5 to 10 mass %;
   (d) a reaction accelerator wherein the concentration of the reaction accelerator is in a range of 5 to 40 mass %, the reaction accelerator being an agent that coordinates to copper as a base material to form a chelate and facilitates forming a bonding layer for bonding resin on a copper surface; and
   (e) a diffusive retaining solvent wherein the concentration of the diffusive retaining solvent is in a range of 5 to 60 mass %,
   wherein the tin salt or tin oxide is at least one selected from the group consisting of stannous sulfate, stannic sulfate, stannous fluoroborate, stannous fluoride, stannic fluoride, stannous nitrate, stannic nitrate, stannous oxide, stannous chloride, stannic chloride, stannous formate, stannic formate, stannous acetate, and stannic acetate.

2. The solution according to claim 1, wherein the inorganic acid is at least one selected from the group consisting of: hydrochloric acid, sulfuric acid, nitric acid, fluoroboric acid, and phosphoric acid.

3. The solution according to claim 1, wherein the organic acid is at least one selected from the group consisting of: carboxylic acid, alkanesulfonic acid, and aromatic sulfonic acid.

4. The solution according to claim 1, wherein the organic acid is at least one selected from the group consisting of: formic acid, acetic acid, propionic acid, butyric acid, methanesulfonic acid, ethanesulfonic acid, benzenesulfonic acid, phenolsulfonic acid, and cresolsulfonic acid.

5. The solution according to claim 1, wherein the concentration of the acid is in a range of 1 to 50 mass %.

6. The solution according to claim 1, wherein the salt or oxide of the at least one type of metal is at least one type of soluble salt or oxide selected from the group consisting of: $Ag_2O$, $ZnO$, $Al_2O_3$, $TiO_2$, $Bi_2O_3$, $Cr_2O_3$, $AgCl$, $ZnI_2$, $AlBr_3$, $BiI_3$, $FeCl_3$, $PdCl_2$, $AuCl$, $Ag_2SO_4$, $Zn(NO_3)_2$, $Al(NO_3)_3$, $NiSO_4$, $CoSO_4$, $CH_3COOAg$, and $(HCOO)_2Zn$.

7. The solution according to claim 1, wherein the reaction accelerator is at least one compound selected from the group consisting of: thiourea, 1,3-dimethyl thiourea, 1,3-diethyl-2-thiourea, and thioglycolic acid.

8. The solution according to claim 1, wherein the diffusive retaining solvent is at least one selected from glycol and glycol ester.

9. The solution according to claim 8, wherein the diffusive retaining solvent is at least one selected from the group consisting of: ethylene glycol, diethylene glycol, propylene glycol, cellosolve, carbitol, and butyl carbitol.

10. An aqueous solution for forming a copper-to-resin bonding layer, comprising:
   (a) at least one type of acid selected from inorganic acid and organic acid;
   (b) tin salt or tin oxide wherein the concentration of the tin salt or tin oxide in terms of the concentration of tin is in a range of 0.1 to 5 mass %;
   (c) salt or oxide of at least one type of metal selected from the group consisting of silver, zinc, aluminum, titanium, bismuth, chromium, iron, cobalt, nickel, palladium, gold, and platinum wherein the concentration of the salt or oxide of the at least one type of metal in terms of the concentration of metal is 0.5 to 10 mass %;
   (d) a reaction accelerator wherein the concentration of the reaction accelerator is in a range of 5 to 40 mass %, the reaction accelerator being an agent that coordinates to copper as a base material to form a chelate and facilitates forming a bonding layer for bonding resin on a copper surface; and
   (e) a diffusive retaining solvent in a range of 5 to 60 mass %, wherein the diffusive retaining solvent is at least one selected from glycol and glycol ester.

11. The solution according to claim 10, wherein the inorganic acid is at least one selected from the group consisting of hydrochloric acid, sulfuric acid, nitric acid, fluoroboric acid, and phosphoric acid.

12. The solution according to claim 10, wherein the organic acid is at least one selected from the group consisting of carboxylic acid, alkanesulfonic acid, and aromatic sulfonic acid.

13. The solution according to claim 10, wherein the organic acid is at least one selected from the group consisting of formic acid, acetic acid, propionic acid, butyric acid, methanesulfonic acid, ethanesulfonic acid, benzenesulfonic acid, phenolsulfonic acid, and cresolsulfonic acid.

14. The solution according to claim 10, wherein the concentration of the acid is in a range of 1 to 50 mass %.

15. The solution according to claim 10, wherein the salt or oxide of the at least one type of metal is at least one type of soluble salt or oxide selected from the group consisting of $Ag_2O$, $ZnO$, $Al_2O_3$, $TiO_2$, $Bi_2O_3$, $Cr_2O_3$, $AgCl$, $ZnI_2$, $AlBr_3$, $BiI_3$, $FeCl_3$, $PdCl_2$, $AuCl$, $Ag_2SO_4$, $Zn(NO_3)_2$, $Al(NO_3)_3$, $NiSO_4$, $CoSO_4$, $CH_3COOAg$, and $(HCOO)_2Zn$.

16. The solution according to claim 10, wherein the reaction accelerator is at least one compound selected from the group consisting of thiourea, 1,3-dimethyl-thiourea, 1,3-diethyl-2-thiourea, and thioglycolic acid.

17. The solution according to claim 10, wherein the diffusive retaining solvent is at least one selected from the group consisting of ethylene glycol, diethylene glycol, propylene glycol, cellosolve, carbitol, and butyl carbitol.

18. The solution according to claim 10, wherein the tin salt or tin oxide is at least one selected from the group consisting of stannous sulfate, stannic sulfate, stannous fluoroborate, stannous fluoride, stannic fluoride, stannous nitrate, stannic nitrate, stannous oxide, stannous chloride, stannic chloride, stannous formate, stannic format, stannous acetate, and stannic acetate.

* * * * *